(12) United States Patent
Aouini et al.

(10) Patent No.: US 10,281,523 B2
(45) Date of Patent: May 7, 2019

(54) TECHNIQUES AND CIRCUITS FOR ON-CHIP JITTER AND PHASE NOISE MEASUREMENT IN A DIGITAL TEST ENVIRONMENT

(71) Applicant: Ciena Corporation, Hanover, MD (US)

(72) Inventors: Sadok Aouini, Ottawa (CA); Naim Ben-Hamida, Ottawa (CA); Chris Kurowski, Ottawa (CA)

(73) Assignee: Ciena Corporation, Hanover, MD (US)

( * ) Notice: Subject to any disclaimer, the term of this patent is extended or adjusted under 35 U.S.C. 154(b) by 65 days.

(21) Appl. No.: 15/708,924

(22) Filed: Sep. 19, 2017

(65) Prior Publication Data

US 2019/0086471 A1 Mar. 21, 2019

(51) Int. Cl.
| | |
|---|---|
| *G01R 31/00* | (2006.01) |
| *G01R 31/317* | (2006.01) |
| *H03L 7/081* | (2006.01) |
| *H01L 27/092* | (2006.01) |

(52) U.S. Cl.
CPC ...... *G01R 31/31709* (2013.01); *H03L 7/0814* (2013.01); *H01L 27/092* (2013.01)

(58) Field of Classification Search
USPC ................................................ 324/613, 617
See application file for complete search history.

(56) References Cited

U.S. PATENT DOCUMENTS

| | | | |
|---|---|---|---|
| 6,380,703 | B1 | 4/2002 | White |
| 6,931,089 | B2 | 8/2005 | Wu et al. |
| 7,233,183 | B1 | 6/2007 | Sancheti |
| 8,384,452 | B1 | 2/2013 | Parker et al. |
| 8,384,456 | B1 | 2/2013 | Ramaswamy |
| 2004/0036538 | A1 | 2/2004 | Devries et al. |
| 2004/0062301 | A1* | 4/2004 | Yamaguchi ............. H04B 7/01 375/226 |

OTHER PUBLICATIONS

Extended European Search Report in corresponding European Patent Application No. 17160147.9 dated Aug. 4, 2017 (7 pages).
Goddard, D. N.; "Passband Timing Recovery in an All-Digital Modem Receiver"; IEEE Transactions on Communications, vol. Com-26, No. 5, pp. 517-523, May 1978 (7 pages).

* cited by examiner

*Primary Examiner* — Vincent Q Nguyen
(74) *Attorney, Agent, or Firm* — Clements Bernard Walker PLLC; Christopher L. Bernard; Lawrence A. Baratta, Jr.

(57) ABSTRACT

Proposed digital on-chip jitter and phase noise measurement techniques and circuits are presented and include the use of a digitally controlled delay locked loop having very fine resolution but limited range to track the phase error between the tested device output clock and its reference clock. Some implementations employ a combination of a high-gain 1-bit phase detector, a digital accumulator and a fine digitally controlled delay element to track the accumulated phase difference between the reference clock and the device under test. Observing the accumulator output is an indication of the jitter and performing a Fast Fourier Transform of the accumulator output provides the phase noise of the device under test.

20 Claims, 10 Drawing Sheets

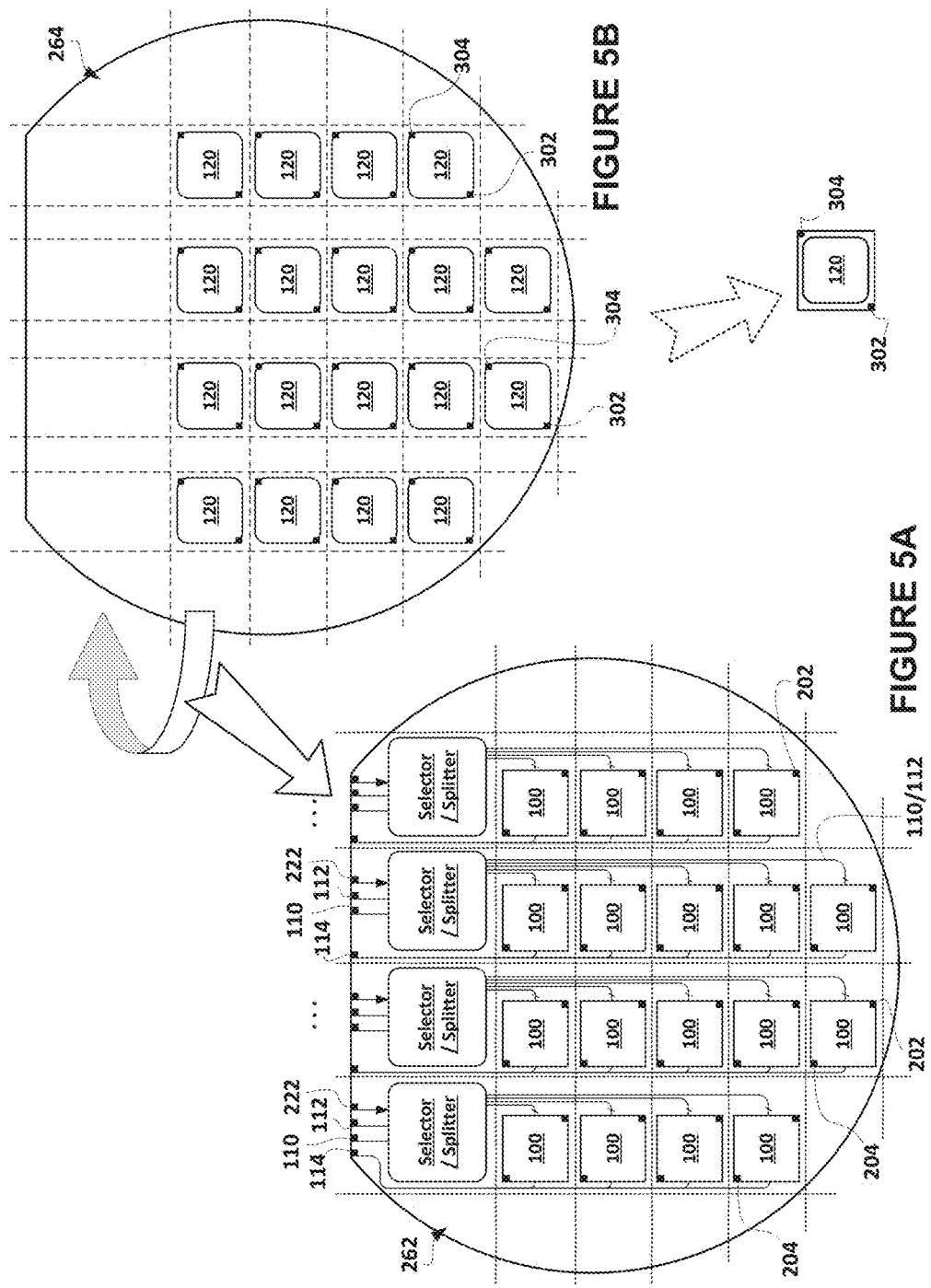

TECHNIQUES AND CIRCUITS FOR ON-CHIP JITTER AND PHASE NOISE MEASUREMENT IN A DIGITAL TEST ENVIRONMENT

TECHNICAL FIELD

The proposed solution relates to jitter and phase noise characterization, and in particular to systems, circuits and techniques for on-chip jitter and phase noise measurement in a digital test environment.

BACKGROUND

In digital communications, traditionally, the jitter and phase noise profile of a electronic component such as a Phase Locked Loop (PLL) is measured using spectrum analyzers. Spectrum analyzers are bulky and expensive equipment making them cumbersome to use during chip level production in a digital production test environment. Other measurement suggestions include using Time-to-Digital Converters (TDCs) to measure phase differences; however, TDCs tend to have resolutions in the order of picoseconds which limits their use only to electronic components (PLL) considered slow for telecommunications purposes and therefore are unsuitable to characterize extremely low jitter PLLs currently being manufactured (~100 fs).

There is a need to improve jitter and phase noise measurement in a digital test environment for a variety of components.

SUMMARY

For example, without limiting the invention thereto, low node FinFet CMOS technology is being considered for manufacturing components in next generation optical transceivers/modems. For example, given high variability in flicker noise, as large as 15 dB, of Voltage Controlled Oscillators (VCOs) implemented employing FinFet technology, system level yield directly impacts production costs.

In accordance with some embodiments of the proposed solution, high resolution jitter and phase noise measurement techniques and circuits are provided having a resolution comparable to what is achievable with a spectrum analyzer but suitable for a digital test environment, particularly suitable, but not limited, to production testing. In some embodiments, such measurement is enabled to be performed on-chip using a digital Delay Locked Loop (DLL) having a high gain 1-bit phase comparator combined with a digital accumulator and a fine resolution digitally controlled delay element to determine phase differences between the device under test and a reference clock. In some implementations, the digitally controlled delay element has a range as large as the max peak-to-peak jitter to be measured for the device under test. By "fine resolution" one means controllable down to one part in a hundred or better within the maximum peak-to-pick jitter range of the device under test.

In other embodiments, test chips are provided for production level jitter and phase noise measurements in digital test environments. In yet other embodiments, test jigs, such as device interface boards, are provided to characterize jitter and phase noise of integrated circuit devices, electronic components incorporating devices to be tested, systems incorporating devices, etc.

In other embodiments, the proposed on-chip jitter and phase noise characterization circuits are employed at run-time, that is during the operation of final products or systems, to provide jitter and phase noise measurement in digital test environments.

In accordance with an aspect of the proposed solution there is provided a digital jitter and phase noise measurement circuit, the circuit comprising a combination of: a high-gain 1-bit phase detector configured to a receive reference clock signal and a feedback signal to provide a phase detector signal; a digital accumulator configured to receive the phase detector signal and output a digital jitter code; and a digitally controlled delay element configured to track an accumulated phase difference between the reference clock signal and a signal output by a device under test such that the output of the digitally controlled delay element provides the feedback signal, said combination providing a digitally controlled delay locked loop having a resolution and range selected to track a phase error between an output signal of the tested device and the reference clock.

In accordance with another aspect of the proposed solution there is provided a method of using a digital jitter and phase noise measurement circuit for characterizing the jitter and phase noise of the device, the digital jitter and phase noise measurement circuit comprising a combination of: a high-gain 1-bit phase detector configured to a receive reference clock signal and a feedback signal to provide a phase detector signal; a digital accumulator configured to receive the phase detector signal and output a digital jitter code; and a digitally controlled delay element configured to track an accumulated phase difference between the reference clock signal and a signal output by a device under test such that the output of the digitally controlled delay element provides the feedback signal, said combination providing a digitally controlled delay locked loop having a resolution and range selected to track a phase error between an output signal of the tested device and the reference clock.

In accordance with yet another aspect of the proposed solution there is provided a method for characterizing the jitter and phase noise of a device, the method comprising: providing a high-gain 1-bit phase detector configured to a receive reference clock signal and a feedback signal to provide a phase detector signal; providing a digital accumulator configured to receive the phase detector signal and output a digital jitter code; and providing a digitally controlled delay element configured to track an accumulated phase difference between the reference clock signal and a signal output by a device under test such that the output of the digitally controlled delay element provides the feedback signal, the combination providing a digitally controlled delay locked loop having a resolution and range selected to track a phase error between an output signal of the tested device and the reference clock.

BRIEF DESCRIPTION OF THE DRAWINGS

The proposed solution will be better understood by way of the following detailed description of embodiments of the invention with reference to the appended drawings, in which:

FIGS. 5A and 5B are schematic diagrams illustrating jitter and phase noise measurement circuits wafer-level manufactured on a separate wafer from devices wafer-level manufactured on other wafers to be tested in accordance with another embodiment of the proposed solution, the combination of FIGS. 5A and 5B illustrating flip-chip testing in accordance with some device characterization procedures proposed herein;

DETAILED DESCRIPTION

For example, given the high variability in Voltage Controlled Oscillator (VCO) flicker noise for latest FinFet nodes, as large as 12-15 dB for an Inductance-Capacitance (LC) VCO in FinFet technology, identifying and discarding parts/devices that have excessive jitter as early as possible during production is desired. Characterizing components and systems in-use is also desired.

Figure 1:
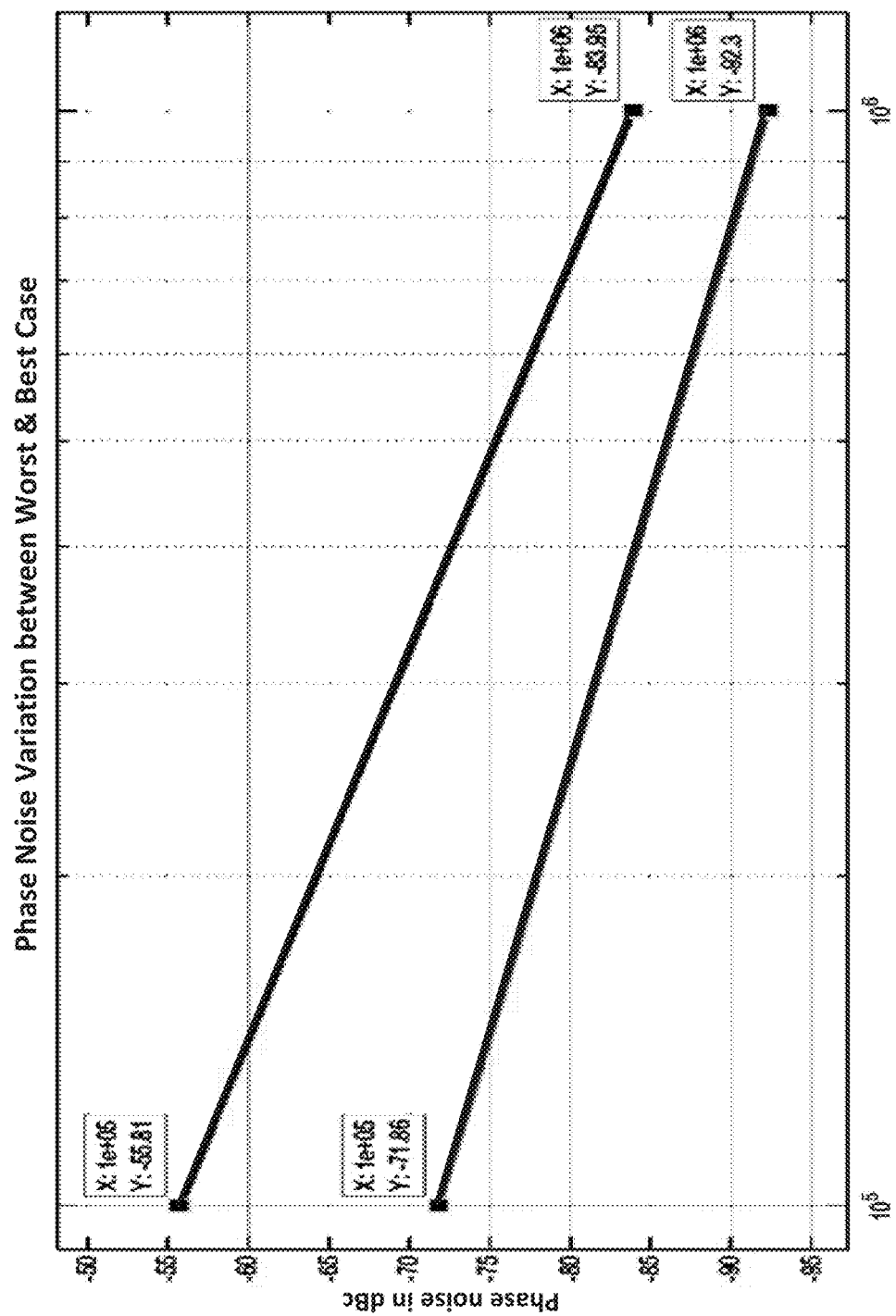
FIG. 1 is schematic plot showing simulated phase noise variability for low node FinFet technology.

FIG. 1 illustrates a plot showing simulated phase noise variability for low node FinFet technology having a larger than 15 dB variation between best and worst case flicker noise model. "dBc" refers to the ratio of power of the noise relative to power in a carrier expressed in decibels.

Being constrained to the digital test environment of the CMOS process, built-in jitter and phase noise measurement circuits are proposed, circuits compatible with a digital Automated Test Equipment (ATE) environment.

The operating principles of proposed digital on-chip jitter and phase noise measurement techniques and circuits include the use of a digitally controlled Delay Locked Loop (DLL) having a very fine resolution but limited range to track the phase error between a tested device output clock and the reference clock input. Some embodiments employ a combination of a high-gain 1-bit phase detector, a digital accumulator and a fine digitally controlled delay element to track the accumulated phase difference between the reference clock and the output of the device under test. Observing the accumulator output provides an indication of the jitter and performing a Fast Fourier Transform (FFT) of the accumulator output provides the phase noise of the device under test.

Figure 2A:
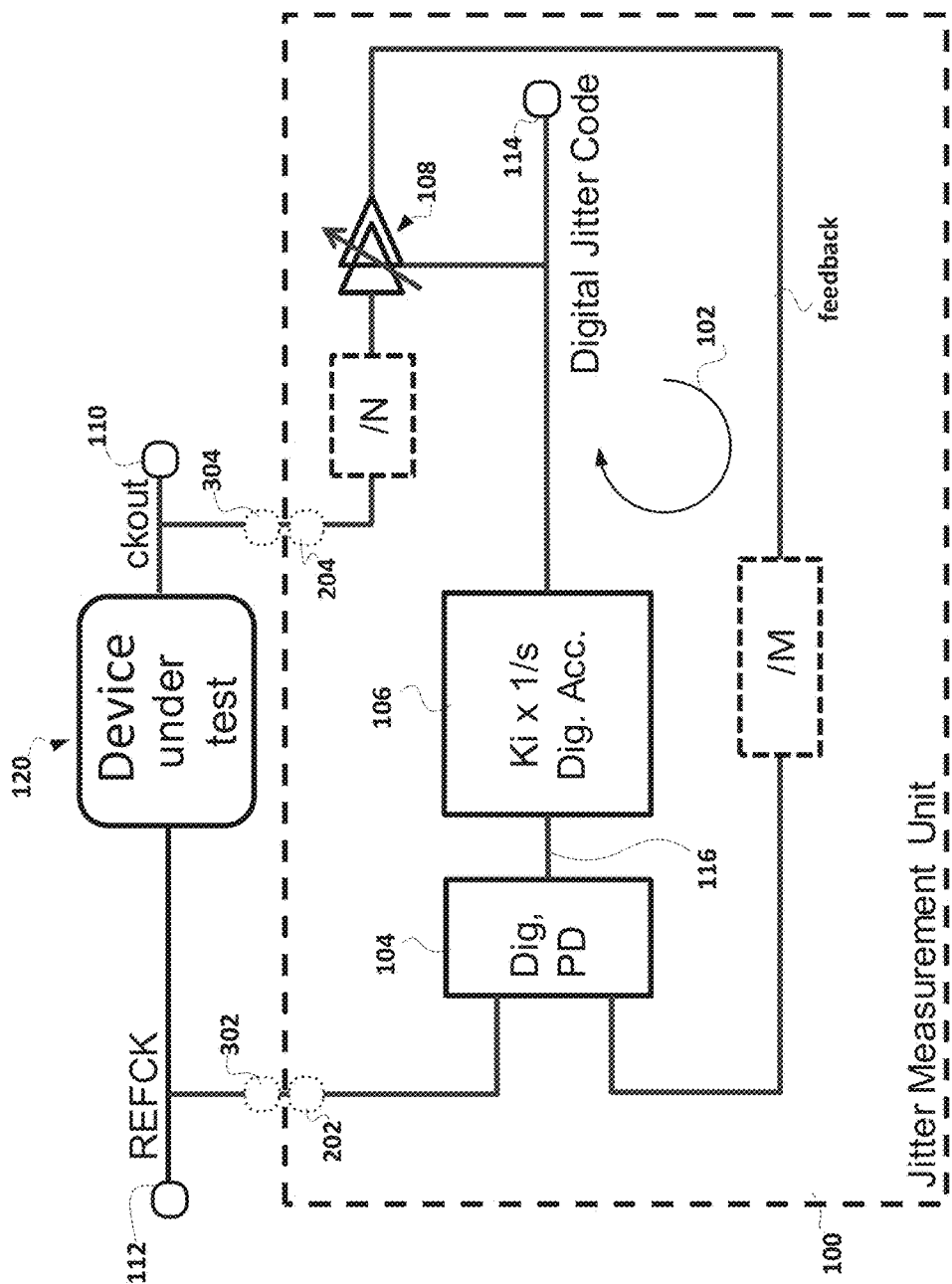
FIG. 2A is a schematic circuit diagram illustrating a circuit schematic in accordance with an embodiment of the proposed solution.

FIG. 2A illustrates, in accordance with an embodiment, such a proposed on-chip jitter and phase noise measurement circuit for characterizing a PLL device in a digital test environment.

A digital on-chip jitter and phase noise measurement circuit 100 includes a digital delay-locked loop 102 built using a 1-bit high gain digital phase detector 104 followed by an accumulator 106 and a very fine digitally controlled delay element 108 to track the accumulated phase difference between the output clock 110 and the reference clock 112 within the DLL 102 tracking bandwidth. The controlled delay element 108 can have a range as large as the peak-to-peak jitter of the device under test to be measured, and a fine resolution controllable down to one part in a hundred or better.

When the device under test 120 is a PLL device, the ideal output clock signal 110 has an approximately constant signal period, various specific periods throughout the output clock signal 110 train may deviate from the ideal output signal period. This deviation may be the result of PLL error introduced by one or more subcomponents of the PLL device for example resulting in excessive cycle-to-cycle period jitter, long term jitter, phase jitter and other forms of phase noise. These and/or other types of phase noise and associated jitter may be characteristic to other devices under test 120. Devices under test 120 having least phase noise and jitter can be preferentially selected from others which underperform.

The high gain digital phase detector 104 determines an amount of PLL error based on the reference clock signal 112 and the feedback output signal. The digital phase detector 104 can have a resolution of about ~20 fs. In some implementations, the high gain digital phase detector can include a non-linear bang-bang phase detector which can be realized using an arbiter or strong-arm comparator. In other implementations, the high gain digital phase detector can include a linear digital phase detector capable of providing a multi-bit output.

Figure 2B:
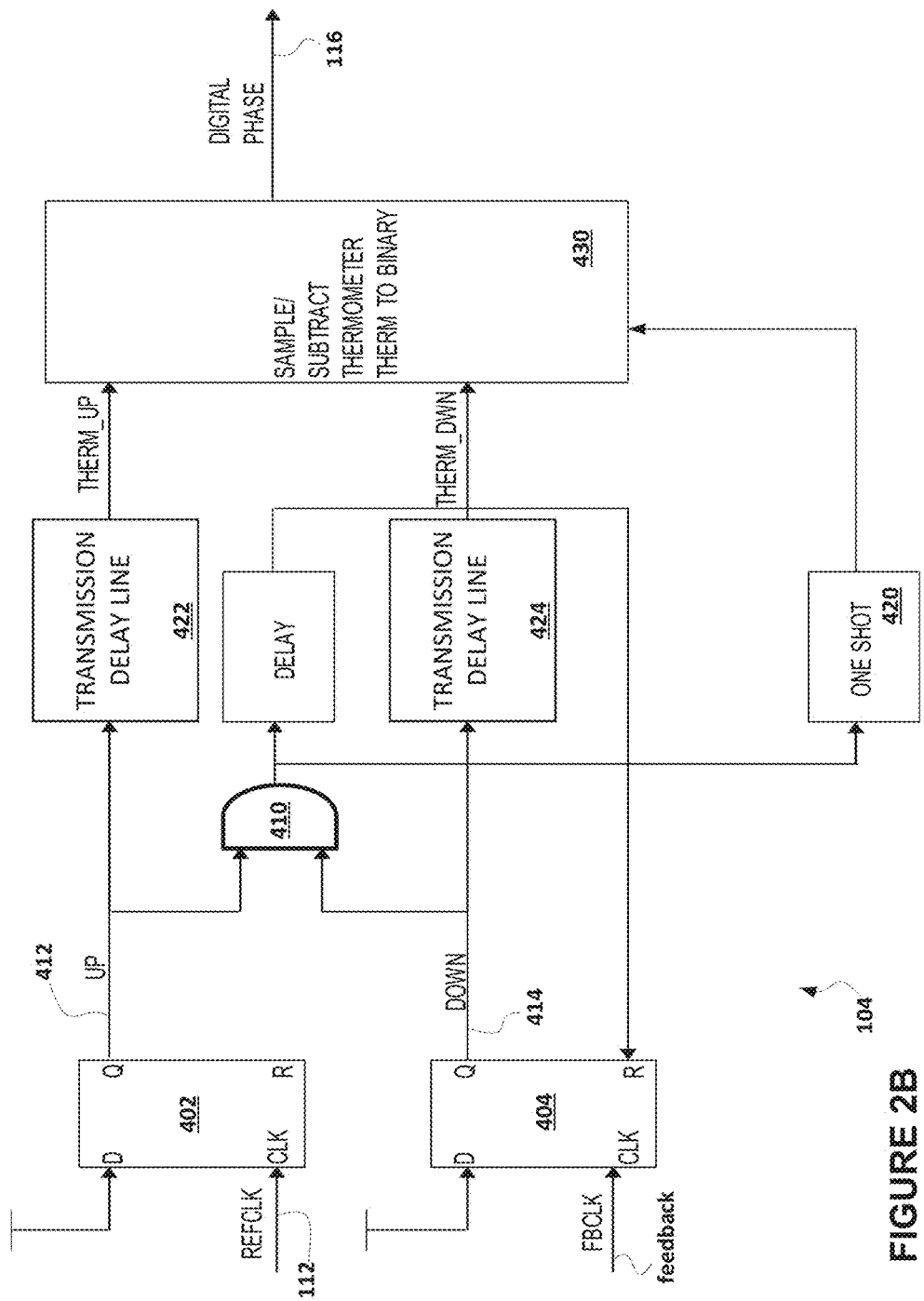
FIG. 2B is a schematic circuit diagram illustrating a realization of a high gain linear digital phase detector employing delay transmission lines in accordance with an implementation of the proposed solution.

FIG. 2B illustrates the realization of a high gain linear digital phase detector 104 employing delay transmission lines 422, 424. Reference clock 112 and feedback signals are employed to clock corresponding flip-flops 402 and 404 which output corresponding step function signals 412 and 414. The Up 412 and Down 414 step function signals are provided to corresponding transmission lines 422 and 424. The clear Up 412 and Down 424 signals are sampled and the feedback signal flip-flop 404 is reset to initialize (following) sampling as is usually done in an overlapping pulse phase detector, for example employing an AND gate 410. Each delay line 422, 424 includes sample points along thereof with inverters (not shown) between sample points. Inverters along the two transmission lines 422, 424 toggle as a corresponding travelling wave of the step function signal 412, 414 propagates through each delay line 422, 424 and passes their location. If the flip-flop 402 is triggered before the flip-flop 404, then a number of additional inverters that are in turn tripped along the transmission line 422 will be higher than a number of inverters (at least one) that tripped in to the transmission line 424. Conversely, if the flip-flop 404 is triggered before the flip-flop 402, then the number of additional inverters that are in turn tripped along the transmission line 424 will be higher than the number of inverters (at least one) that tripped in to the transmission line 422. A one-shot trigger element 420 can be employed to control the lowest number of inverters triggered in a transmission line 422, 424. The number of inverters triggered in delay line 422, THREM_UP, and the number of inverters triggered in delay line 424, THREM_DWN, are compared by comparator 430 when triggered by the output of the trigger element 420. Digital phase signal 116 is output by the comparator 430. For example, THERM_UP and THERM_DWN can be digital thermometer words of a length equal to the number of inverters tripped on the delay line 422, 424. This first realization of the linear phase detector implementation has a relatively lower range but likely has a better accuracy.

Figure 2C:
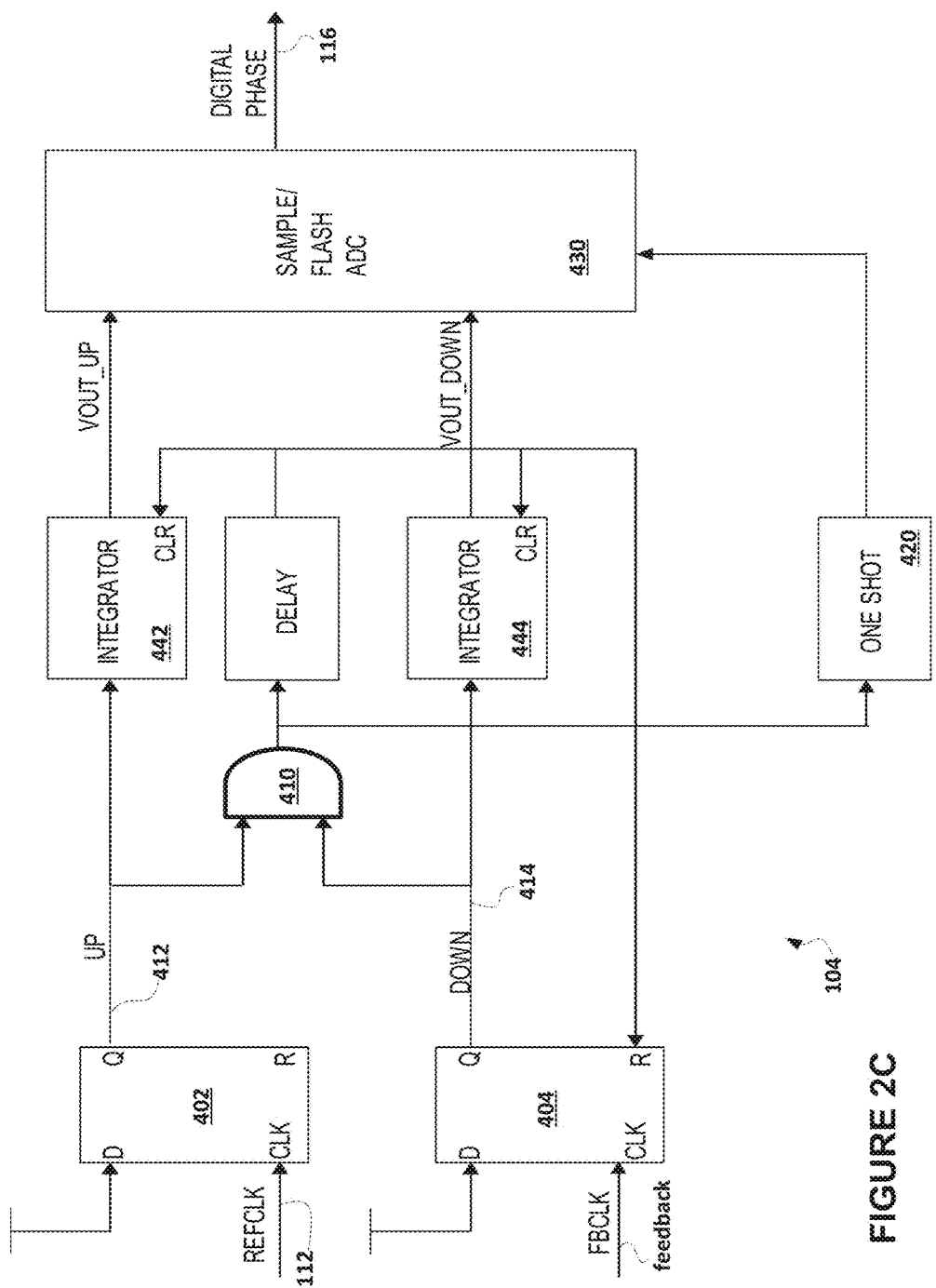
FIG. 2C is a schematic circuit diagram illustrating another realization of a high gain linear digital phase detector employing integrators in accordance with another implementation of the proposed solution.

FIG. 2C illustrates another realization of a high gain linear digital phase detector 104 employing integrators 442, 444. Description of similar elements in FIG. 2B is not repeated. The Up and Down step function signals 412, 414 each trigger the start of corresponding charging processes on preferably identical integrator circuits 442, 444 that drive current into precharged capacitors (on both sides P and N). Both step function signals 412 and 414 will have substantially identical turn on and turn off characteristics until prior to the sensing non-overlapping pulses phase detector 410. In preferred implementations, step function signals 412 and 414 act identically and a voltage difference across the two capacitors represents linearly the difference in charging pulse length time between the step function signals 412 and 414. The difference in voltage between the capacitors is output by comparator 430, for example implemented as an offset compensated flash converter. The output provides the digital phase signal 116.

Figure 3A:
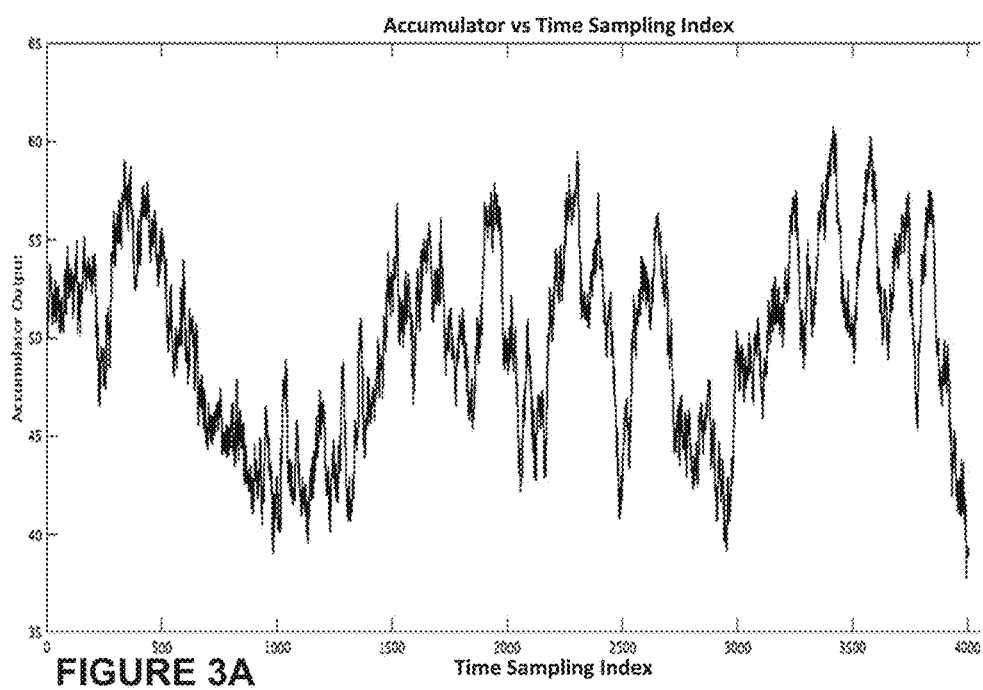
FIGS. 3A and 3B are schematic plots illustrating representations of experimental measurements in accordance with an implementation of the proposed solution.
Figure 3B:
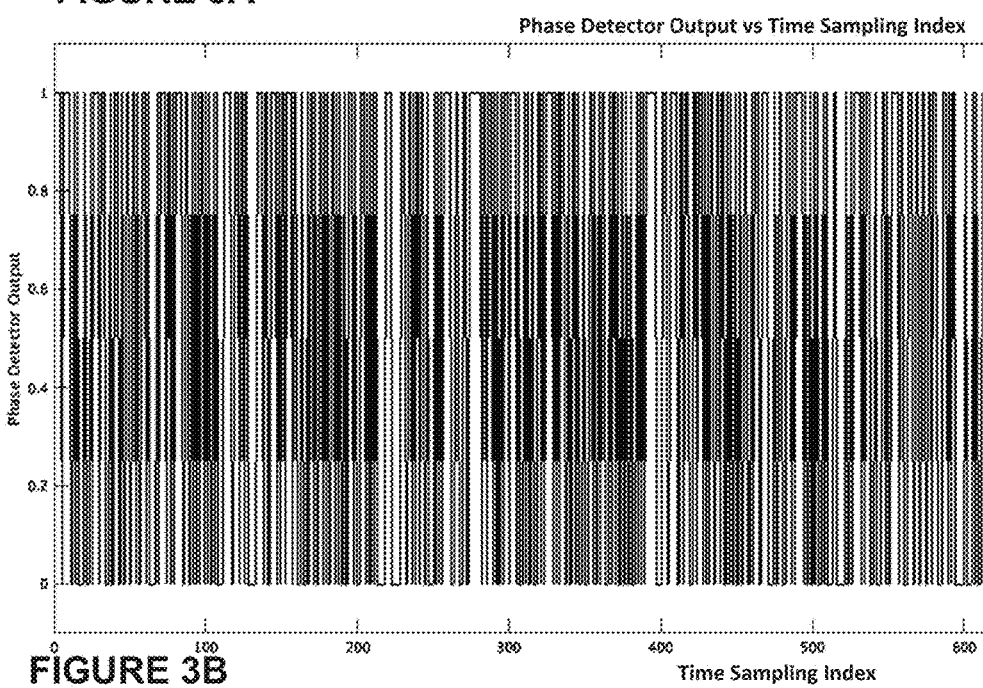

FIG. 3B illustrates a representation of variability measured at the phase detector output 116.

Returning to FIG. 2A, the delay element 108 is a digitally programmable device which includes functionality to adjust the rising edge or falling edge of the feedback signal within a predefined resolution and/or bandwidth range. Preferably the digitally controlled delay element 108 has a small range of a few ps and a control resolution of about ~20 fs.

The digital accumulator code 114 can be used to extract jitter information. The digital accumulator 106 may include functionality to produce a digital code signal 114 for operating the digital delay element 108. For example, such a digital code signal may include a binary code designating whether the delay element 108 moves the rising edge of the feedback signal. For example, if the digital accumulator 106 produces a code signal with a '1', then the delay element 108 may delay the feedback signal by a specific amount of time. If the code signal is a '0', then the delay element 108 may advance the feedback signal by a specific amount of time. However, as illustrated in FIG. 3A, the code signal is a multibit code signal '100101' which determines a specific amount of phase delay or an amount of phase advance with finer time steps. For example, performing an FFT of the accumulator output 114 would provide the power spectral density of the phase error produced by the device 120 under test (phase noise).

To control sampling rate(s) of the delay locked loop 102, a feedback "IN" divider circuit can be employed in the signal path between the output of the tested device 120 (PLL) and the input of the digital delay element 104, a feedback "/M" divider circuit can be employed in the feedback signal path between the output of the digital delay element 108 and the digital phase detector 104, or both. Each feedback divider can be implemented in hardware, such as in an integrated circuit (rollover counter), that includes functionality to divide the frequency of the output signal 110 or the feedback signal. Particularly when the device under test 120 is a PLL incorporating a VCO, the operating frequency output by the VCO may be a multiple of the reference clock and is reduced by the feedback divider(s) down to the frequency of the reference clock for jitter and phase noise measurement herein.

The proposed solution has been experimentally verified. FIGS. 3A and 3B illustrate, in accordance with the proposed solution, representations of experimental measurements of digital on-chip jitter. FIG. 3A illustrates a representation of variability measured at the accumulator output 114 while FIG. 3B illustrates a representation of variability measured at the phase detector output 116.

Figure 3C:
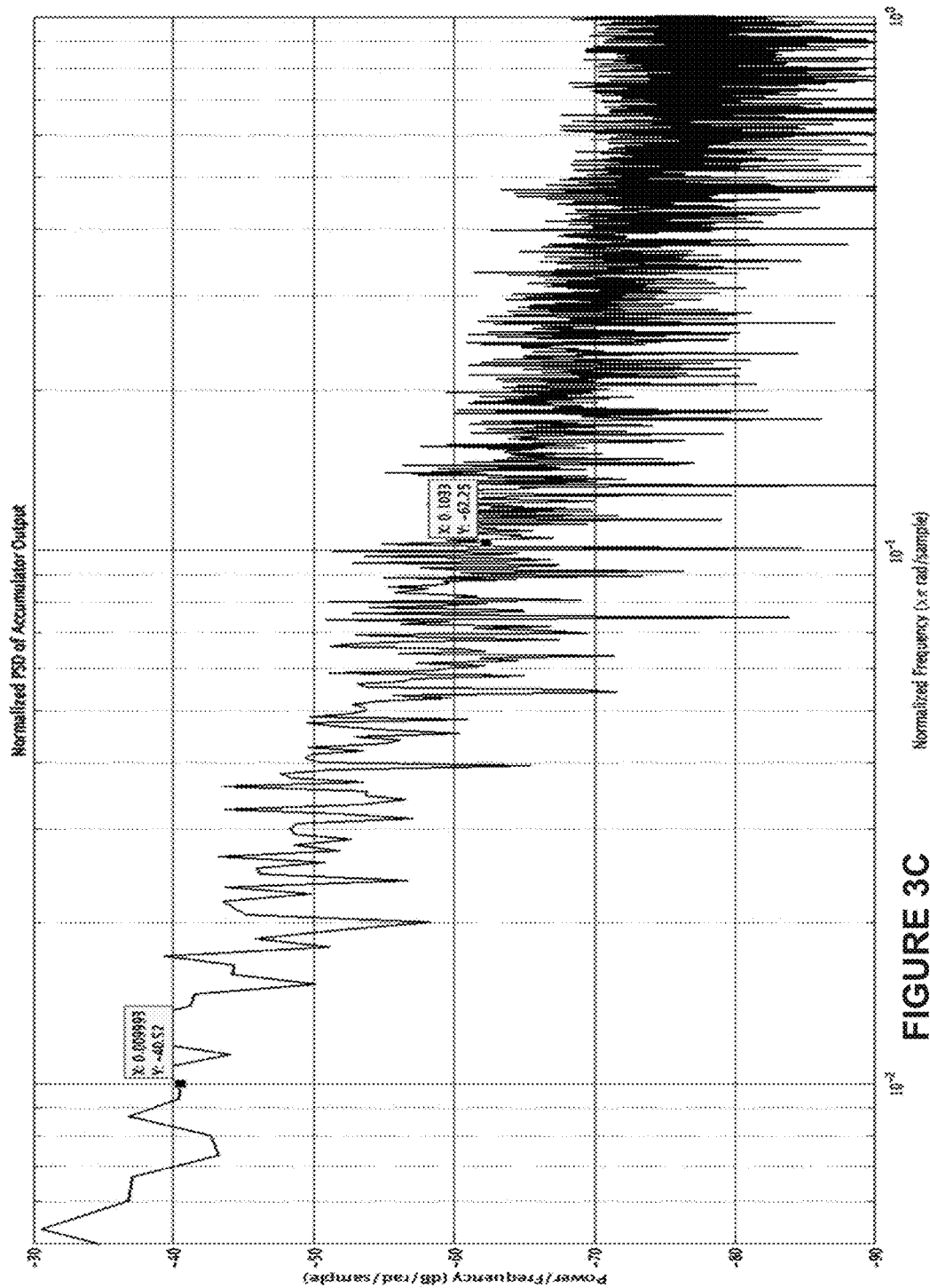
FIG. 3C is a schematic plot illustrating a representation of power spectral density of the phase error corresponding to measurements illustrated in FIGS. 3A and 3B in accordance with the implementation of the proposed solution.

Given the phase resolution (~20 fs) of the digitally controlled delay element 108, the jitter standard deviation and peak-to-peak value can be determined. In addition, performing the FFT of the digital data output at 114 would provide the power spectral density of the phase error (phase noise). FIG. 3C illustrates a representative FFT.

Employing the above combination at least in a (CMOS wafer level) production test environment enables on-chip jitter and phase noise measurement to provide improved component qualification and selection leading to an improved production yield. For example, clock output 110 of transceiver/modems production tested and selected in accordance with the proposed solution would express a tight jitter and phase noise distribution, performance which would be (strongly) desired.

Benefits can be derived from implementing the proposed solution at wafer-level manufacture and/or chip-level production. For example, the cost of finding a faulty device goes up by a factor of ten between manufacturing levels (die, packaged chip, board, etc.) Discarding faulty/defective/sub-par devices 120 such as, but not limited to: PLLs, VCOs, Digital to Analog Converters (DACs), Serializer/Deserializers (SerDes) (jitter transfer function and jitter mask), having unacceptable jitter as early as possible would lower the overall cost of transceivers, modems, pluggable modules, line cards, etc. incorporating such devices. In other embodiments digital clock trees are characterized with respect to jitter with the intent to discard components having excessive jitter.

While a single jitter and phase noise measurement circuit 100 is illustrated in FIG. 2A for the tested 120 device, the invention is not limited thereto. It would be understood that in practice multiple devices 120 would be wafer-level manufactured on a single wafer in parallel and such a jitter and phase noise measurement circuit 100 would be operatively connected to selectively characterize at least a subgroup of devices 120 wafer-level manufactured concurrently.

Figure 4A:
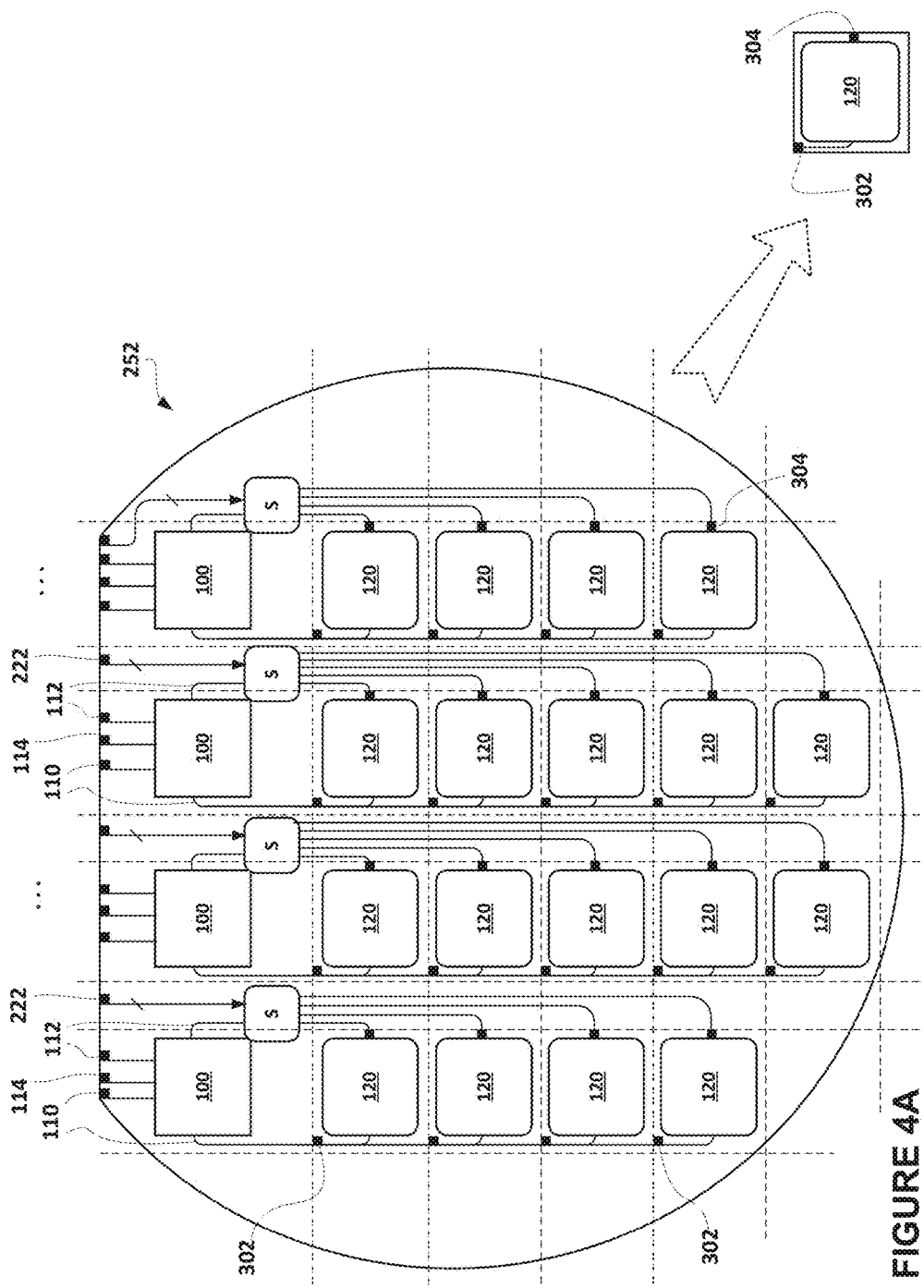
FIGS. 4A and 4B are schematic diagrams illustrating jitter and phase noise measurement circuits wafer-level manufactured on the same wafer with devices to be characterized in accordance with various embodiments of the proposed solution.

For example, in accordance with one embodiment of the proposed solution, FIG. 4A illustrates an arrangement of multiple wafer-level manufactured devices wafer-level manufactured together with jitter and phase noise measurements circuits. Each jitter and phase noise measurement circuit 100 is wafer-level manufactured on the same wafer 252 with a corresponding group of devices 120 to be wafer-level tested. Selector/splitter circuitry "S" for selection of each device 120 for characterization is also wafer-level manufactured along with a corresponding jitter and phase noise measurement circuit 100 on the same wafer 252. Each jitter and phase noise measurement circuit 100 is provided with reference clock signal 112 (and can also be configured to output the clock signal 110 from the selected device under test 120) via signal traces routed for example to an edge of the wafer 252. Another trace 222 carries a control signal from the edge of the wafer 252 to selector/ splitter S corresponding to the jitter and phase noise measurement circuit 100. For example, selector/splitter S can be configured to route the reference clock signal 112 between the jitter and phase noise measurement circuit 100 and the device 120 selected for testing in response to control signal 222. The digital jitter code output 114 from the accumulator (106) is routed to another pad on the edge of the wafer 252. The wafer edge pads are employed in providing connection upstream to automated test equipment (not illustrated).

After characterization, a selection of devices 120 having desired compliant performance can be sectioned off from the jitter and phase noise measurement circuits 100 proposed herein during chip level manufacture of the devices 120. Dashed lines indicate dicing lines for singulating devices 120 out of the wafer 252 after qualification. In accordance with the illustrated implementation, the jitter and phase noise measurement circuits 100, selector/splitter circuits S and interconnecting traces are wafer-level manufactured on sacrificial portions of the wafer 252. The dotted arrow represents singulation of individual devices 120. Singulation exposes device connection pads 302, 304 for each device 120 die. It is understood that only a small group of the illustrated features are labeled solely in order to simplify illustration herein. For example, ground and power traces, and pads are omitted.

Figure 4B:
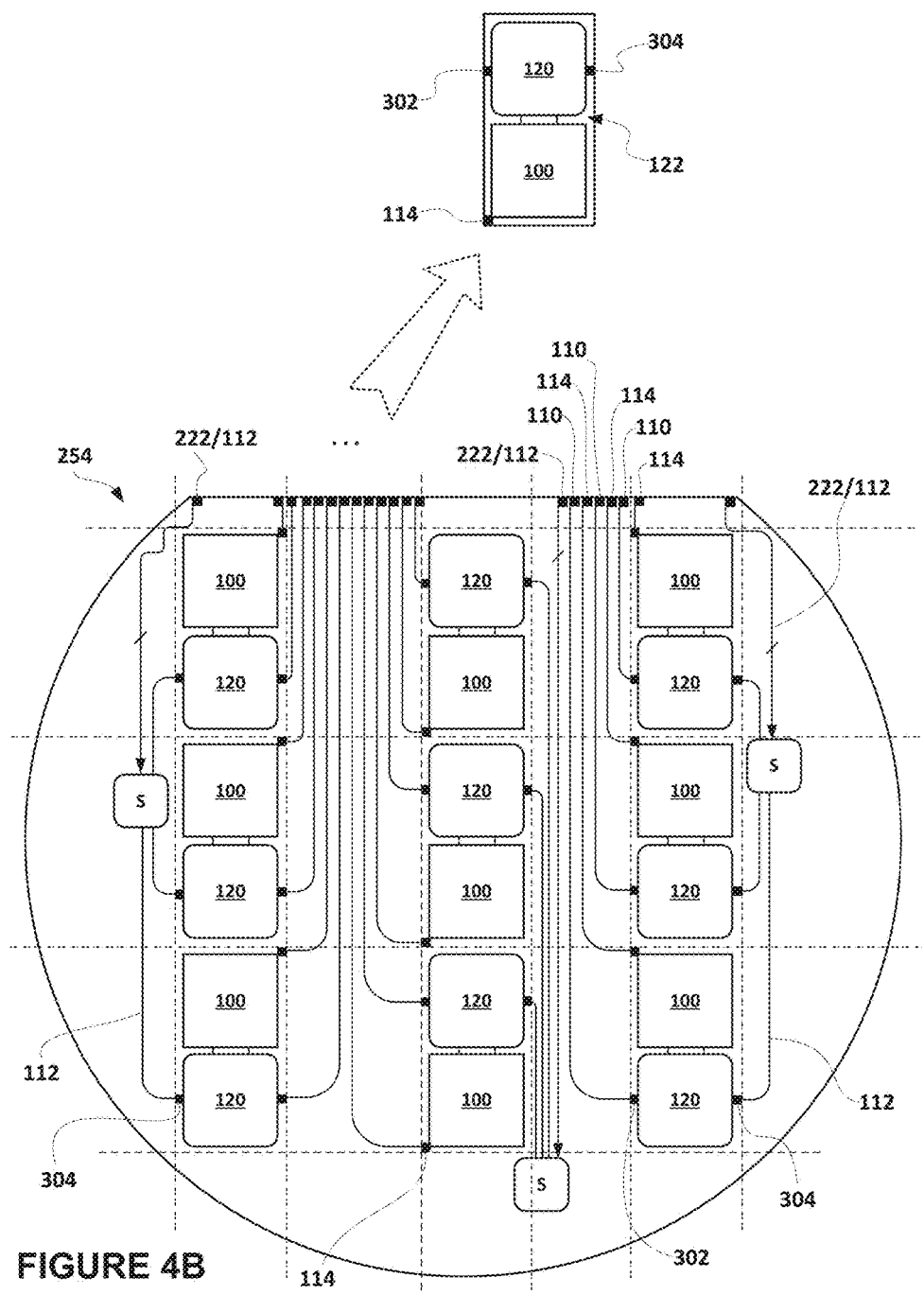

As another example, in accordance with another embodiment of the proposed solution, FIG. 4B illustrates another arrangement of multiple wafer-level manufactured devices wafer-level manufactured together with jitter and phase noise measurements circuits. Each jitter and phase noise measurement circuit 100 is wafer-level manufactured on the same wafer 254 with a corresponding device 120. Selector (or splitter) circuitry "S" for selection of each device 120 for characterization is also wafer-level manufactured on the same wafer 254, for example in sacrificial portions of wafer 254. Each jitter and phase noise measurement circuit 100 is provided with reference clock signal 112 (for example when selected via signal 222) (and can be configured to output the clock signal 110 from the selected device 120 under test) via signal traces routed, for example, to an edge of the wafer 254. Trace 222 is (a bus) illustrated to carry the control signal from the edge of the wafer 254 to selector/splitter S together with the reference clock signal 112. For example, selector/splitter S routes the clock signal 112 to the selected jitter and phase noise measurement circuit 100 for testing as directed by control signal 222. The digital jitter code output 114 from the accumulator 106 of each jitter and phase noise measurement circuit 100 is routed to corresponding pads on the edge of the wafer 254. The wafer edge pads are employed in providing connection upstream to automated test equipment (not illustrated).

After characterization and selection of devices 120 having desired compliant performance, each device 120 and corresponding jitter and phase noise measurement circuit 100 proposed herein can be sectioned off together during chip level manufacture of the devices 120. Dashed lines indicate dicing lines for singulating dice 122 including a device 120 and its corresponding jitter and phase noise measurement circuit 100 out of the wafer 254 after wafer level characterization. As mentioned herein, in accordance with the illustrated implementation, the selector/splitter circuit(s) S and interconnecting traces are wafer-level manufactured on sacrificial portions of the wafer 254. The dotted arrow represents singulation of each die 122 including device 120 and its corresponding jitter and phase noise measurement circuit 100. Singulation exposes device connection pads 302, 304 for each device 120 and digital jitter code output 114 pad on the edges of the die 122. It is understood that only a small group of the illustrated features are labeled solely in order to simplify illustration herein. For example, ground and power traces and pads are omitted. Without limiting the invention, additional circuitry (not shown) can be wafer-level manufactured on each die 122 to activate/deactivate jitter and phase noise measurement circuit 100. The combination of the device 120 and jitter and phase noise measurement circuit 100 can be used to characterize and/or qualify intermediate or final components or systems incorporating die 122 during subsequent manufacturing and/or operation of such intermediate or final components or systems.

In accordance with another embodiment of the proposed solution, FIGS. 5A and 5B illustrate separately manufactured wafers, a wafer 264 including wafer-level manufactured device 120 arrays and another corresponding wafer 262 including wafer-level manufactured jitter and phase noise measurement circuit 100 arrays.

For example, wafer 262 having multiple jitter and phase noise measurements circuits 100 implements at least a portion of automated test equipment. The wafer 262 has an arrangement of pads 202, 204 (only a few pairs labeled) and selection/splitter circuitry labeled "Selector". Reference clock 112, output clock 110 and digital jitter code 114 traces can be routed to an edge of the wafer 262 to corresponding pads. The wafer edge pads are employed in providing connection upstream to automated test equipment (not illustrated). For example, ground and power traces and pads are omitted. Of note, the dotted lines schematically represent wafer alignment marks solely for ease of description herein. In practice alignment can be provided via other known flip-chip wafer-level manufacture methods.

Wafer 264 including devices 120 has an arrangement of pads 302, 304 corresponding to pads 202, 204 of wafer 262. Dashed lines illustrate score lines employed for dicing and/or flip-chip wafer alignment. Multiple device wafers 264 are wafer-level manufactured in batches and each wafer 264 is wafer-level mass characterized (in parallel) in flip-chip fashion by connection to testing wafer 262. For example, without limiting the invention thereto, arrows indicate left-to-right flipping device wafer 264 and placement of the flipped wafer 264 over on top of testing wafer 262 such that pads 302, 304 register with pads 202, 204. The top active surface of testing wafer 262 can be protected from electrical shorts by a passivation layer or SiO2 glass layer, except for pads 202, 204 which are left exposed. Electrical contact between pads 202/302 and 204/304 can be provided by employing a conductive material such as a layer of conductive paste. In other implementations (not shown), pads 202, 204 of the testing wafer 262 make electrical contact with sacrificial (not shown) test connection pads on the wafer 264 different from pads 302, 304. For example, such sacrificial test connection pads limit testing damage and/or surface contamination of devices 120 on wafer 264 prior to singulation (dotted arrow).

Additional benefits can be derived by employing the proposed solution in intermediate and final products, either during manufacture, integration, deployment, provisioning and/or at run-time to provide assessments of the jitter performance of the overall systems in use in real time.

Figure 6A:
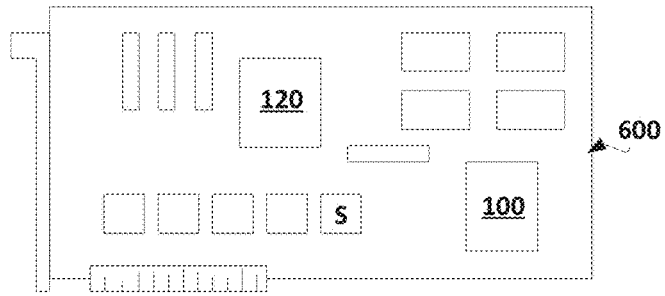
FIGS. 6A and 6B are schematic diagrams illustrating electronic components employing the jitter and phase noise measurement circuits of the proposed solution in various digital test environments in accordance with different embodiments thereof.

In accordance with another embodiment of the proposed solution, FIG. 6A illustrates jitter and phase noise measurement in a digital test environment. For example, an integrated circuit implementing the jitter and phase noise measurement circuit 100, for example schematically illustrated in FIG. 2A, is employed in an electronic component schematically represented by daughter card 600. Jitter and phase noise measurement circuit 100 is soldered on, or connected via a socket to, a Printed Circuit Board (PCB) of the daughter card 600 in electrical connection with device 120 tested and/or monitored. The electrical connection can be selective. A selector/splitter S can provide electrical connection to either one such device 120 at a time (multiple such devices 120 on the same daughter card are shown in FIG. 6C) and/or provide the electrical connection only during test time periods (for example during daughter card manufacture, qualification, deployment, provisioning, etc.) or during monitoring time periods (for example at run-time).

Figure 6B:
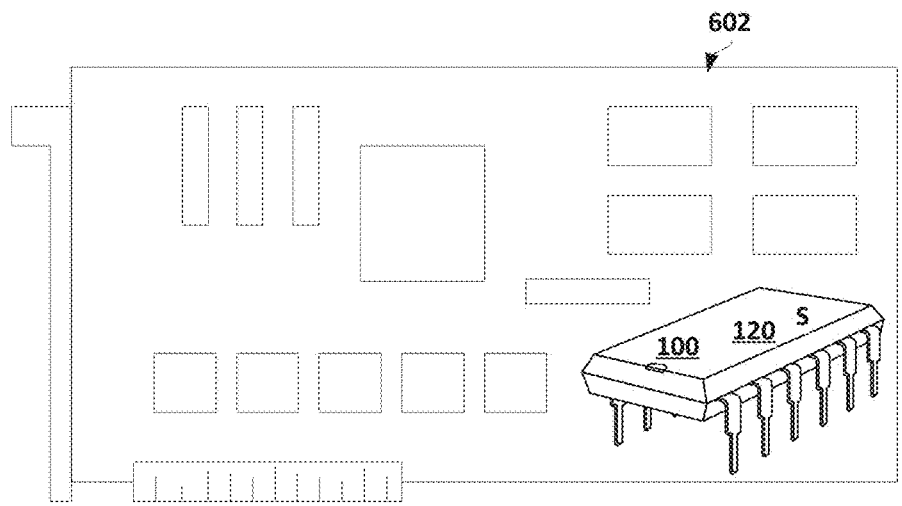

In accordance with another implementation of the proposed solution, FIG. 6B illustrates a daughter card component 602 employing a die 122 (FIG. 4B) chip-level manufactured into an integrated circuit. The integrated circuit optionally also includes a selector S for selectively activating/deactivating jitter and phase noise measuring circuit 100 within.

In accordance with other embodiments of the proposed solution, the jitter measurement circuit 100 can be incorporated into automated test equipment in order to provide or augment jitter measurement capabilities of automated test equipment, including providing phase noise measurements. For example, the jitter and phase noise measurement circuit 100 is manufactured into an integrated circuit, itself integrated into a device interface board 700 having a connector 702. A daughter board component 704 having at least one device 120 to be tested in a digital test environment is connected to the device interface board 700 via the connector 702. Results of jitter and phase noise measurement can be displayed on a display 710 of the automated test equipment. In some implementations electronic components 600, 602 and 704 can include line cards, transceivers, modems, etc. incorporating device 120.

Figure 7:
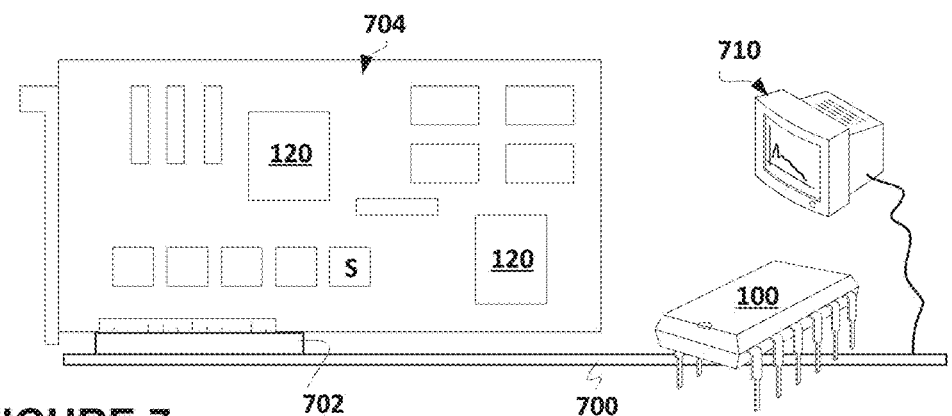
FIG. 7 is schematic diagram illustrating a digital test environment in accordance with an embodiment of the proposed solution, wherein similar features bear similar labels throughout the drawings. While the sequence described can be of significance, reference to "first", "next", "subsequent", "last", "left to right", "top" and "bottom" qualifiers in the present specification is made solely with reference to the orientation of the drawings as presented in the application and does not imply any absolute spatial orientation.

It is understood that while FIG. 7 illustrates an entire daughter board 704 being connected to the device interface board 700, the invention is not limited thereto. In some implementations the connector 702 is an integrated circuit socket configured to receive an integrated circuit, for example a device 120, 122 die packaged into an integrated circuit component. The connector 702 can be a Zero-Insertion Force (ZIF) socket configured to repeatedly receive integrated circuit devices 120, 122 to be characterized.

In accordance with various implementations of the proposed solution, the jitter and phase noise measurement circuit 100 can be selectively decoupled/deactivated after system deployment and/or provisioning at run-time in order to minimize power consumption of the overall system. The jitter and phase noise measurement circuit 100 can be selectively reactivated at run-time for real-time troubleshooting purposes. Switch-on/switch-off circuitry is schematically represented throughout the description herein as (selector) S.

In some embodiments upper layer control elements in a communications system/network/network-element are configured to query the proposed jitter and phase noise measurement circuit 100 in order to provide improved communications traffic monitoring, communications traffic protection planning, and/or communications traffic restoration functionality.

Providing jitter and phase noise measurements in a digital test environment has been found comparable or superior to spectrum analyzer testing in that the testing provided as described herein reduces production costs overall, including providing early identification of less than suitable devices.

For certainty, such a jitter and phase noise measurements are understood to be employed in a digital test environment in conjunction (either in sequence or in parallel) with employing the tested devices such as Phase Locked Loops (PLLs), Voltage Controlled Oscillators (VCOs), Digital to Analog Converters (DACs), Serial/Deserializers (SerDes), but not limited to ones described above for other intended purposes (such as but not limited to conveying data) for example image acquisition.

While the invention has been illustrated and described with reference to preferred embodiments thereof, it will be recognized by those skilled in the art that various changes in form and detail may be made therein without departing from the spirit and scope of the invention as defined by the appended claims.

What is claimed is:

1. A digital jitter and phase noise measurement circuit, the circuit comprising:
a high-gain 1-bit phase detector configured to receive a reference clock signal and a feedback signal to provide a phase detector signal;
a digital accumulator configured to receive the phase detector signal and output a digital jitter code; and
a digitally controlled delay element configured to accumulate phase differences between the reference clock signal and a signal output by a device under test such that the output of the digitally controlled delay element provides the feedback signal,
wherein a digitally controlled delay locked loop is provided, the digitally controlled delayed locked loop having a resolution and range selected to characterize a phase error between an output signal of the tested device and the reference clock.

2. The circuit as claimed in claim 1, wherein the digitally controlled delay element has a range of the same order of magnitude as an acceptable phase error range for the device under test.

3. The circuit as claimed in claim 1, wherein the range of the digitally controlled delay element is less than about 10 ps and the resolution of the digitally controlled delay element is about 20 fs.

4. The circuit as claimed in claim 1, wherein the phase detector is selected from one of a linear phase detector and a non-linear phase detector.

5. The circuit as claimed in claim 4, wherein the non-linear phase detector is one of a strong-arm comparator and a bang-bang arbiter.

6. The circuit as claimed in claim 1, wherein the circuit is one of a circuit wafer-level manufactured on a wafer; an integrated circuit die singulated from a wafer; an integrated circuit die packaged into an integrated circuit package; a test circuit wafer-level manufactured with a corresponding device on a wafer; an integrated circuit die also including the device; an integrated circuit die packaged into an integrated circuit package with a corresponding device; a sacrificial circuit wafer-level manufactured with a selector for a group of devices to be tested on the same wafer; an electronic component incorporating at least one device; a device interface card of an automated test equipment; a line card; a pluggable module; a transceiver and a modem.

7. The circuit as claimed in claim 6, wherein the wafer-level level manufacture includes CMOS wafer-level manufacture.

8. The circuit as claimed in claim 1, wherein the device is one of a phase locked loop device; a voltage controlled oscillator; a digital to analog converter; a serializer; a deserializer; and a device having a digital clock tree.

9. The circuit as claimed in claim 6, wherein wafer-level manufacture of the device includes FinFet wafer-level manufacture.

10. The circuit as claimed in claim 1, further comprising a divider circuit to control sampling in one of the signal path between the output of the tested device and the input of the digital delay element, and the feedback signal path between the output of the digital delay element and the phase detector.

11. The circuit as claimed in claim 1, further comprising a selector for selectively activating and deactivating the circuit.

12. A digital jitter and phase noise measurement circuit for characterizing a phase locked loop component, the circuit comprising:
 a high-gain 1-bit phase detector configured to receive a reference clock signal and a feedback signal to provide a phase detector signal;
 a digital accumulator configured to receive the phase detector signal and output a digital jitter code; and
 a digitally controlled delay element configured to accumulate phase differences between the reference clock signal and a signal output by the phase locked loop component such that the output of the digitally controlled delay element provides the feedback signal,
 wherein a digitally controlled delay locked loop is provided, the digitally controlled delayed locked loop having a resolution and range selected to characterize a phase error between an output signal of the phase locked loop component and the reference clock.

13. A method for characterizing the jitter and phase noise of a device, the method comprising:
 receiving a reference clock signal and a feedback signal at a high-gain 1-bit phase detector configured to provide a phase detector signal;
 receiving the phase detector signal at a digital accumulator configured to accumulate phase differences between the reference clock signal and a signal output by a device under test and configured to output a digital jitter code; and
 receiving the digital jitter code at a digitally controlled delay element configured to output the feedback signal,
 wherein a digitally controlled delay locked loop is provided having a resolution and range selected to characterize a phase error between an output signal of the tested device and the reference clock.

14. The method as claimed in claim 13, comprising employing a divider circuit in one of the signal path between the output of the tested device and the input of the digital delay element, and the feedback signal path between the output of the digital delay element and the phase detector.

15. The method as claimed in claim 13, comprising observing the accumulator output as an indication of jitter of the tested device.

16. The method as claimed in claim 15, further comprising performing a Fast Fourier Transform of the accumulator output to provide a phase noise measurement of the tested device.

17. The method as claimed in claim 16, further comprising obtaining a power spectral density of the phase error.

18. The method as claimed in claim 16, further comprising determining one of a jitter standard deviation and a peak-to-peak value.

19. The method as claimed in claim 13, further comprising selectively activating and deactivating the circuit.

20. The method as claimed in claim 16, further comprising selectively qualifying the tested device as one of compliant and non-compliant in accordance with one of the jitter and phase noise characterization of the device.

* * * * *